(12) United States Patent
Behel et al.

(10) Patent No.: US 8,149,028 B2
(45) Date of Patent: Apr. 3, 2012

(54) METHOD AND DEVICE FOR DIVIDING A FREQUENCY SIGNAL

(75) Inventors: John Kevin Behel, Greensboro, NC (US); Reuben Pascal Nelson, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 51 days.

(21) Appl. No.: 12/365,458

(22) Filed: Feb. 4, 2009

(65) Prior Publication Data

US 2010/0195785 A1    Aug. 5, 2010

(51) Int. Cl.
*H03K 19/00* (2006.01)
*H03K 23/00* (2006.01)

(52) U.S. Cl. ..................... 327/117; 327/115

(58) Field of Classification Search .............. 327/115, 327/117
See application file for complete search history.

(56) References Cited

U.S. PATENT DOCUMENTS

| | | | |
|---|---|---|---|
| 5,694,087 A * | 12/1997 | Ferraiolo et al. | 331/11 |
| 6,404,839 B1 | 6/2002 | Fong et al. | |
| 6,421,754 B1 | 7/2002 | Kau et al. | |
| 6,542,013 B1 * | 4/2003 | Volk et al. | 327/115 |
| 6,725,245 B2 * | 4/2004 | Bucska | 708/103 |
| 7,196,559 B2 * | 3/2007 | Chien | 327/115 |
| 7,479,815 B1 * | 1/2009 | Groe et al. | 327/156 |
| 2003/0042506 A1 | 3/2003 | Kellgren et al. | |
| 2003/0208513 A1 * | 11/2003 | Bucska | 708/103 |
| 2008/0012617 A1 * | 1/2008 | Boerstler et al. | 327/175 |
| 2008/0297209 A1 | 12/2008 | Scuteri | |
| 2010/0172466 A1 * | 7/2010 | Herrmann et al. | 378/19 |

OTHER PUBLICATIONS

PCT International Search Report and Written Opinion mailed on Mar. 31, 2010, from PCT/US10/022749.
International Preliminary Report on Patentability mailed on Aug. 18, 2011, from PCT/US10/022749.

* cited by examiner

*Primary Examiner* — Ryan Jager
(74) *Attorney, Agent, or Firm* — Kenyon & Kenyon LLP

(57) ABSTRACT

A method for dividing a frequency includes the steps of receiving a first signal having a first frequency as a clock input to a first digital counter and outputting a second signal as a clock input to a second digital counter having a higher counting capacity than the first counter. The output occurs when the first counter reaches a first number of count cycles. The method also includes generating a third signal having a high cycle and a low cycle, which are determined at least as a function of the first number of count cycles. Depending on a desired division ratio, the high and low cycles may also be a function of a second number of count cycles associated with the second counter. The third signal has a frequency lower than the first frequency.

26 Claims, 11 Drawing Sheets

US 8,149,028 B2

METHOD AND DEVICE FOR DIVIDING A FREQUENCY SIGNAL

BACKGROUND INFORMATION

Frequency dividers transform an analog or digital input signal into an output signal having a lower frequency. In the context of digital or radio-frequency electronics, it is sometimes desirable to divide a high frequency input clock signal into one or more lower frequency output signals. A first conventional high speed divider, known as a pulse swallow divider, utilizes a dual modulus prescaler divider architecture which includes a combination of a high speed dual modulus prescaler coupled with a programmable B counter and a swallow A counter. The prescaler operates at a high frequency while the A and B counters operate based on the lower frequency output of the prescaler.

Disadvantages of the pulse swallow divider include a need for two slow speed counters and an output which is not naturally symmetric, i.e., the duty cycle of the output is uneven. The output is usually at one phase, e.g., logic level HIGH, for a period equal to one prescaler output clock period, and in another phase, e.g., logic level LOW, for a period equal to that of an output clock of the B counter minus one period of the prescaler output clock. To produce a 50/50 duty cycle, an additional divide-by-2 circuit is necessary. However, this solution only works for even division ratios. For odd ratios, additional duty cycle correction circuitry is needed, adding further complexity. Further, the divide-by-2 circuit requires that the input clock and the output signal be related by a multiple of 2, causing a restricting effect on clock distribution chips, which often require the production of multiple output frequencies.

A second conventional divider utilizes a single high speed counter and a flip-flop which toggles its state when the counter reaches a selectable load value selected to correspond to a desired number of input clock cycles the flip-flop should remain in a HIGH or LOW state. A disadvantage of the second divider is that a maximum depth—and therefore a division ratio—of the divider is limited by the speed of the counter and any associated control logic. Large counters also consume high amounts of power.

SUMMARY

A first exemplary embodiment of the present invention relates to a method for dividing a frequency. The method includes: receiving a first signal having a first frequency as a clock input to a first digital counter; outputting a second signal as a clock input to a second digital counter having a higher counting capacity than the first counter, the output occurring when the first counter reaches a first number of count cycles; and generating a third signal having a high cycle and a low cycle, which are determined at least as a function of the first number of count cycles, the third signal having a frequency lower than the first frequency.

A second exemplary embodiment of the present invention relates to a device for dividing a frequency. The device includes: a first digital counter configured to receive a first signal having a first frequency as a clock input; a second digital counter configured to receive a second signal as a clock input, the second counter having a higher counting capacity than the first counter, the second signal being output when the first counter reaches a first number of count cycles; and an output arrangement configured to generate a third signal having a high cycle and a low cycle, which are determined at least as a function of the first number of count cycles, the third signal having a frequency lower than the first frequency.

DETAILED DESCRIPTION OF EXAMPLE EMBODIMENTS

The present invention relates to methods and devices for dividing frequency signals. Exemplary embodiments of the present invention are described with reference to the division of a digital input signal into a lower frequency output signal. The exemplary embodiments described may be used to achieve high division ratios. In one embodiment, the output signal may default to a 50/50 duty cycle with the aid of a duty cycle adjustment arrangement which is enabled during odd division ratios. Further, the duty cycle and a phase offset of the output cycle may be adjustable by selecting appropriate counter load values. Thus, uneven duty cycles are also possible. The exemplary embodiments may also enable a bypass mode of operation whereby the input signal is propagated without division (equivalent to divide-by-1). The present invention may be utilized anywhere a frequency division is desired, for example, in a phase-locked loop. However, the present invention may be especially advantageous in large scale circuits, e.g., circuits that generate multiple clock signals at different frequencies from a common higher frequency clock, and also where tight propagation delay matching between signal paths associated with bypass and division modes is required. Although the exemplary embodiments are shown as Complementary Metal Oxide Semiconductor (CMOS) implementations, other digital logic families, e.g., current mode logic (CML) or transistor-transistor logic (TTL), may also be used, either alone or in combination, to implement the present invention.

Figure 1:
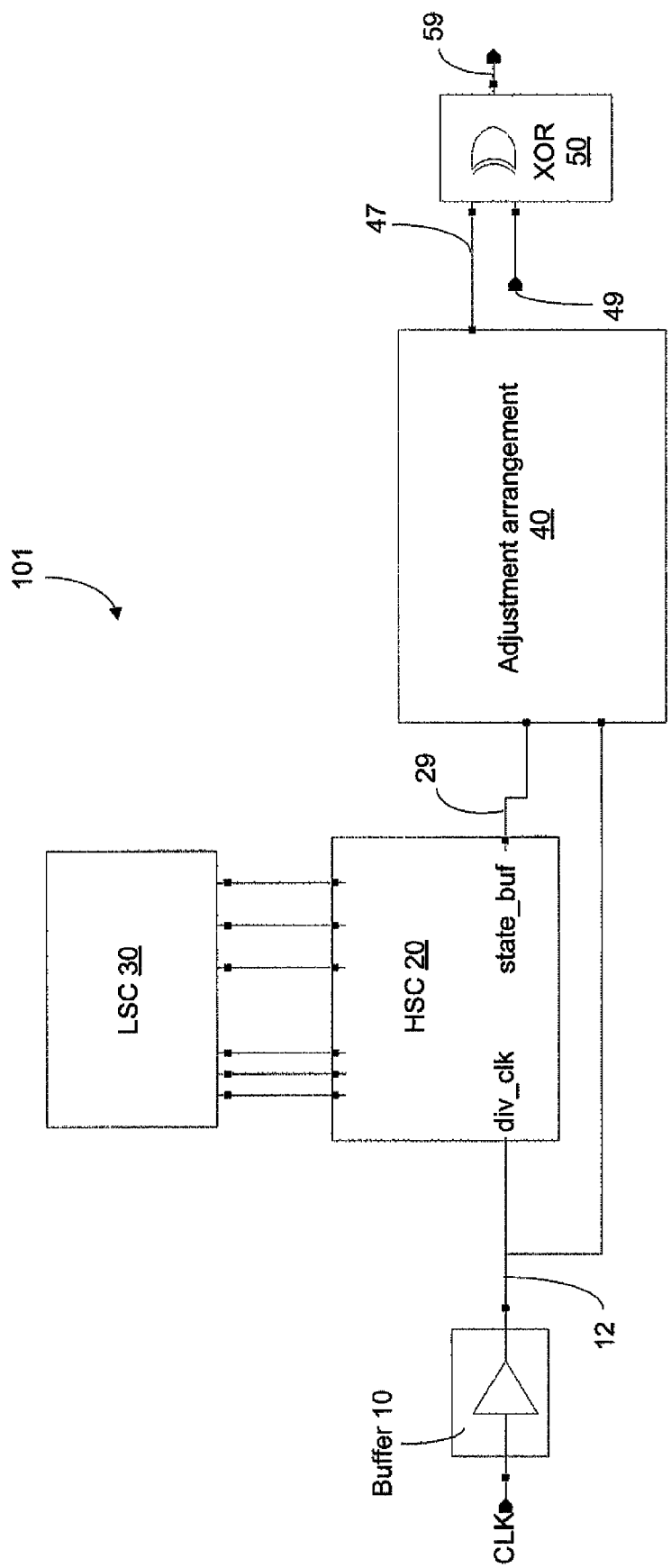
FIG. 1 shows a block diagram of a device for dividing a frequency signal according to an example embodiment of the present invention.

FIG. 1 shows a block diagram of a device 101 for dividing a frequency signal according to an example embodiment of the present invention. The device 101 is configured to receive a digital clock signal, CLK as input and produce an output signal 59 which is a divided version of the CLK signal. The device 101 may include a buffer 10, a high speed counter (HSC) 20, a low speed counter (LSC) 30, a duty cycle adjustment arrangement 40, and an XOR gate 50.

The CLK signal may be any digital signal having a frequency, including, for example, a signal from a reference clock in an electronic system or a digitized version of an analog signal from an oscillation circuit. As shown in FIG. 1, the CLK signal is input to the buffer 10, which may be configured to, if necessary, boost a signal strength of the CLK signal. A buffered output is input to the HSC 20 as a divider clock signal, div_clk 12.

The HSC 20 is connected to the LSC 30 and an output signal of the HSC 20, state_buf 29 is connected to the adjustment arrangement 40. The HSC 20 may be any digital counter configured to count based on a selectable load value, where a length of each count cycle is determined by the signal div_clk 12. In one embodiment, the HSC 20 may be a count down counter, however it may also be possible to implement the HSC 20 as any type of counter, e.g., a count up or a gray code counter. The same is true for the LSC 30. For example, in an alternative embodiment one counter may count up and the other down. Each count cycle of the HSC 20 may correspond to a single period of the CLK signal. Starting from the load value, a count value of the HSC 20 may decrement, e.g., decrease by one, in response to transitions between clock periods. This may occur on either a rising edge or a falling edge of the CLK signal.

The LSC 30 may be a count down counter with a larger counting capacity than the HSC 20. In one embodiment, the HSC 20 includes a three-bit counter while the LSC 30 includes a 27-bit counter. The LSC 30 may receive, as an input clock, a clock output of the HSC 20. Because the input clock of the LSC 30 is the clock output of the HSC 20, the LSC 30 counts at a slower rate than the HSC 20. The LSC 30 clock output may be generated each time the HSC 20 reaches its maximum number of count cycles, determined by the load value. Each time the maximum number of count cycles of the HSC 20 is reached, e.g., whenever the HSC 20 reaches zero, the LSC 30 may decrement by a set value, e.g., one. Like the HSC 20, the LSC 30 may also count beginning from a selectable load value. Because the LSC 30 runs at a much lower speed, this allows the LSC 30 to have a greater depth, e.g., 27 bits as opposed to 3. The large depth enables large division ratios. As will be explained, when a desired division ratio exceeds a threshold value, the counting of both the HSC 20 and the LSC 30 are used to determine the output signal 59 of the device 101. When the desired division ratio does not exceed the threshold, only the counting of the HSC 20 may affect the output signal 59.

The following equations describe the behavior of the HSC 20 and LSC 30:

When the division ratio is at or below the threshold value $(2*2^K)$:

$HI=\text{floor}((R-1)/2)$ $LO=\text{floor}(R/2)$ $LHI \text{ and } LLO=0$

When the division ratio exceeds $2*2^K$:

$HI=\text{floor}((R-1)/2)\%(M+1)+(M+1)$ $LO=\text{floor}(R/2)\%(M+1)+(M+1)$ $LHI=\text{floor}((R-1)/2^K)-1$ $LLO=\text{floor}(R/2^K)-1$ Where,
K is equal to the number of bits of the HSC 20,
R is equal to the desired division ratio, D, minus one (R=D−1),
HI is the load value of HSC 20 at the beginning of a high phase cycle,
LO is the load value of the HSC 20 at the beginning of a low phase cycle,
LHI is the load value of LSC 30 during the HIGH phase of the output cycle,
LLO is the load value of the LSC 30 during the low phase of the output cycle,
M is the minimum number of input clock cycles between each LSC clock output, e.g. $M=2^{K-1}-1$, and
% is the modulus operator.

The minimum number of input clock cycles between LSC clock outputs, M may be any integer value greater than 1 and is selected to prevent the counters 20, 30 from outputting too quickly relative to the CLK signal. Each time the HSC 20 reaches zero, the value of M is loaded as a default load value if the LSC 30 has not reached zero as well. However, if the HSC 20 reaches zero and the LSC 30 has also reached zero, either the HI value or the LO value is loaded into the HSC 20 preset, while the corresponding LHI or LLO value is loaded into the LSC 30. The state of the output signal 59 determines which value is loaded, where HI and LHI will be loaded if the current output state is a logic LOW and LO and LLO will be loaded if the current output state is a logic HIGH. The result is that the HIGH and LOW phases of the output signal 59 are generated by adding a specific number of input clock cycles to each subsequent output phase in order to obtain a desired division, where the number of cycles added is a function of the load or default values (e.g., HI+1 or LO+1 when the threshold is not exceeded). In this regard, LHI and LLO may be viewed as the number of extra times the HSC 20 is cycled in each respective HIGH and LOW divider output phase. The value of M may be experimentally determined or based on a known operating speed of the counters 20, 30. Another factor that may influence the selection of M is the speed of the input clock, e.g., the div_clk signal 12. In this embodiment, the value of M is equal to $2^{K-1}-1$, however any suitable value may be chosen.

A total output period, Tout, is:

$Tout[2+(HI+(M+1)*LHI)+(LO+(M+1)*LLO)]*Tclk,$
where Tclk is the period of CLK signal.

Based on the equations above, it may be seen that Tout has an even duty cycle, i.e., 50/50, when the division ratio D is an even number. However, the duty cycle is uneven whenever the division ratio is odd. As an illustrative example, in the situation when the division ratio D is 4, the threshold value $(2*2^3)$ is not exceeded and the HIGH phase is equal to floor(2/2) or 1, while the LOW phase is equal to floor(3/2) or 1. When the division ratio is 5, the HIGH phase is equal to floor(3/2) or 1, while the LOW phase is equal to floor(4/2) or 2. Thus, the HIGH and LOW phases do not match when the division ratio is odd.

The uneven duty cycle may be corrected by the adjustment arrangement 40, which, as will be described, may be implemented with much less complexity than the duty cycle correction circuits associated with conventional dividers. The adjustment arrangement 40 may be any combination of circuit components needed to adjust a duty cycle of the output generated by the counters 20, 30. Output of the adjustment arrangement, e.g., an adjusted output signal 47, may be provided to the XOR gate 50. Details of the adjustment arrangement 40 will be provided further below.

The XOR gate 50 functions as an inverter when coupled with an inversion control signal 49. The signal 49, when asserted, forces the output of the NOR gate, output signal 59, LOW if the adjusted output signal 47 is HIGH and HIGH when the adjusted output signal 47 is LOW. Thus, the output signal 59 is equivalent to the adjusted output signal 47 when the signal 49 is not asserted, and has opposite logic values to those of the adjusted output signal 47 when the signal 49 is asserted.

Exemplary embodiments of the various components of the device 101 will now be described. In the example embodiments, the LSC 30 includes control logic configured to control the operation of the counters 20, 30. Additionally, output generated by the HSC 20 may be processed, e.g., by an output arrangement such as a flip-flop, to generate a preliminary output signal as input to the adjustment arrangement 40. Conceptually, the output arrangement, and any other pre-adjustment processing components, may be included as part of the HSC 20. It will be understood, however, that the control logic and the pre-adjustment processing components may be located almost anywhere within the device 101 and need not be tied, either physically or conceptually, to the HSC 20 or the LSC 30.

Figure 2:
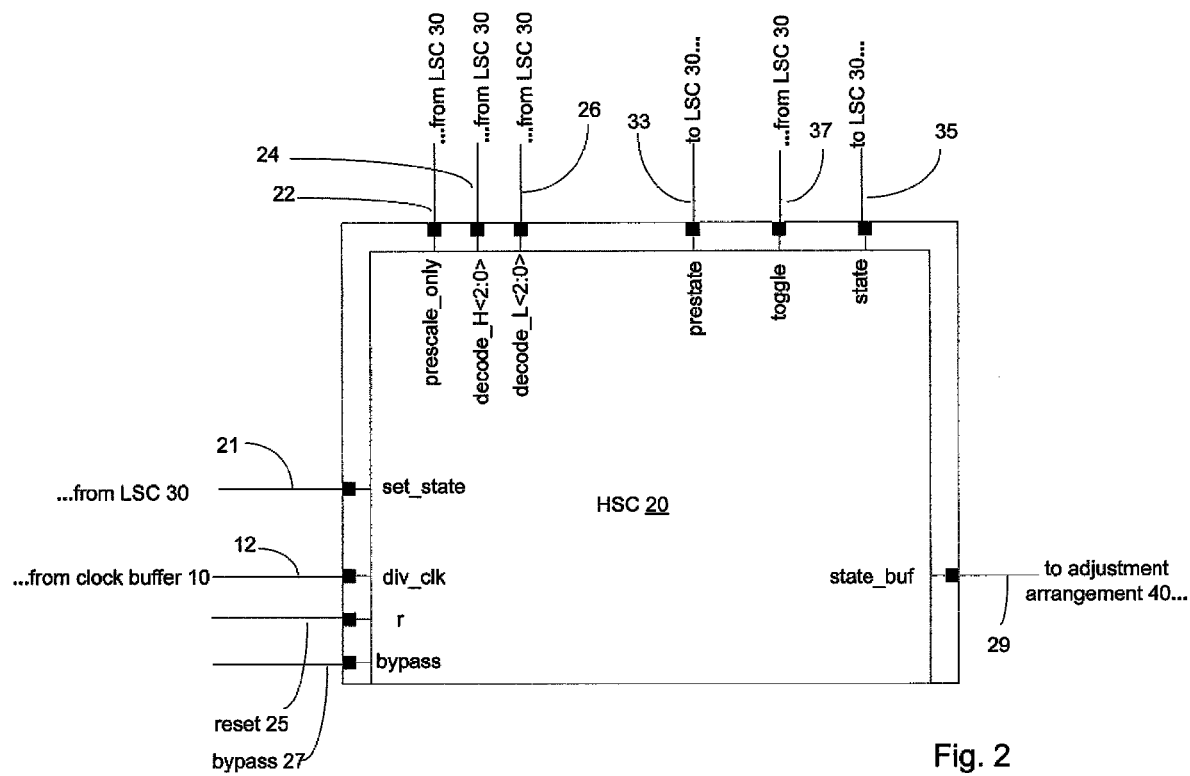
FIG. 2 shows a block diagram of a high speed counter according to an example embodiment of the present invention.

FIG. 2 shows a block diagram of the HSC 20 according to an example embodiment of the present invention. As shown in FIG. 2, input signals to the HSC 20 may include the div_clk signal 12, a reset signal 25, and a bypass signal 27. The reset signal 25 may be a master reset and, when asserted, results in a resetting of the count value of the HSC 20, e.g., to a default load value. The bypass signal 27, when asserted, results in a disabling of counting in the HSC 20, so that division does not occur. Other inputs may include a prescale_only signal 22, a decode_H signal 24, a decode_L signal 26, a toggle signal 37, and a set_state signal 21. The prescale_only signal 22 is a control signal which is asserted when the division ratio does not exceed the threshold value. As explained below, the prescale_only signal 22 controls whether the HSC 20 outputs its current state to the LSC 30. The decode_H and decode_L signals 24, 26, respectively correspond to load values for the HSC 20 calculated in accordance with the equations for HI and LO previously described. In the embodiment shown, the signals 24, 26 are each 3-bits to match the counter of the HSC 20.

Outputs of the HSC 20 may include the state_buf signal 29, which is connected to the adjustment arrangement 40, a prestate signal 33, and a state signal 35.

The set_state signal 21 controls the output arrangement. In particular, the set_state signal 21 may be a set input to a flip-flop. The set_state signal 21 may be produced by the LSC 30 and can be used to set the initial starting phase of an output signal of the flip-flop, e.g., the flip-flop's output will be logic LOW if the reset signal 25 is applied to the flip flop, however, if set_state signal 21 is asserted at a time after the reset signal 25, then it will be HIGH. The prestate signal 33 functions as the output clock of the HSC 20 and, as previously described, controls counting of the LSC 30. The prestate signal 33 may be asserted whenever the counter of the HSC 20 reaches zero. The state signal 35 represents a current state (e.g., HIGH or LOW) of the flip-flop and may be output to the LSC 30 in order to indicate the current state of the output to the LSC 30 so that the LSC 30 can determine what presets to load, e.g., whether the HI and LHI or LO and LLO values will be loaded for the next cycle after the HSC 20 and LSC 30 reach zero.

Figure 3:
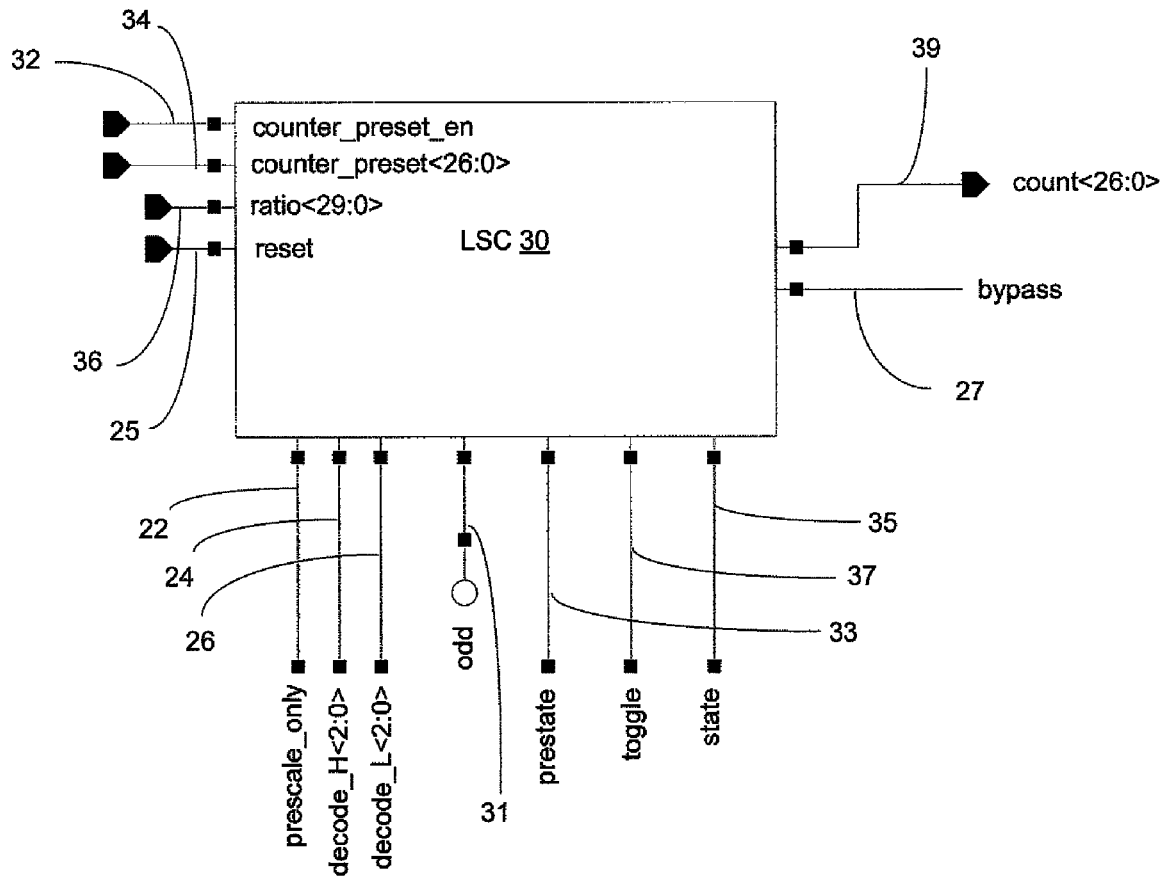
FIG. 3 shows a block diagram of a low speed counter according to an example embodiment of the present invention.

FIG. 3 shows a block diagram of the LSC 30 according to an example embodiment of the present invention. In one embodiment, the LSC 30 may be implemented at least partially using synthesized logic. For example, the control logic may be written in a hardware description language such as Verilog. In alternative embodiments, the LSC 30 may be implemented with discrete logic components and other digital components. For illustration purposes, the LSC 30 will only be described as a block component, since the actual implementation of the LSC 30 is relatively straight-forward in view of the functionality of the LSC 30 described herein.

As shown in FIG. 3, inputs of the LSC 30 may include the prestate signal 33 and the state signal 35 described above. Further inputs may include a ratio signal 36, and the reset signal 25. The reset signal 25 may have the same function as described previously in reference to the HSC 20. In particular, the reset signal 25 resets a count value of the LSC 30.

In another embodiment, a further input of the LSC 30 may include a starting phase signal that indicates the phase of the initial signal out of the divider. The starting phase signal may be a word value used to make two parallel dividers that are set to the same division start up with a different phase relationship. For example, it may be desirable to wait a few extra input clock cycles before toggling the output signal of a first divider by using a different initial value for HI, LHI or LO, LLO that is calculated using the starting_phase signal of a second divider. By selecting different preset values, each divider may have a programmable initial output phase.

Output of the LSC 30 may include the prescale_only signal 22, the decode_H signal 24, the decode_L signal 26, an odd signal 31, the toggle signal 37, the bypass signal 27, and the set_state signal 21 (not shown). The odd signal 31 indicates whether the division ratio is odd or even, and may be used to control the adjustment arrangement 40 to correct the duty cycle when the division ratio is odd. The toggle signal 37 may be output to the HSC 20 to control toggling of the flip-flop, and may be asserted whenever the count value of the LSC 30 reaches zero. The LSC 30 may set the bypass signal high when the divider is set to divide by 1 (e.g. R=0).

Figure 4:
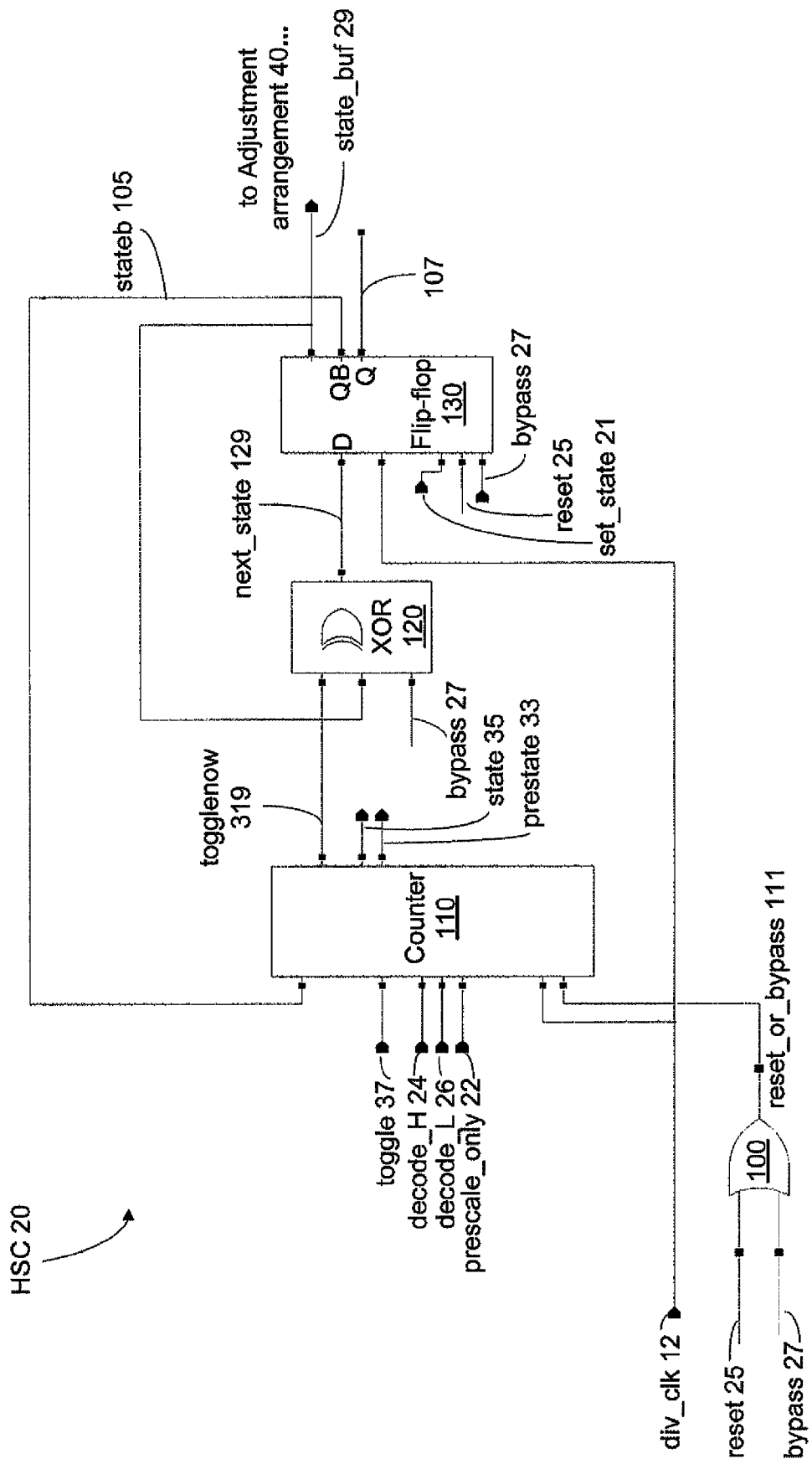
FIG. 4 shows a detailed schematic of the high speed counter of FIG. 2, according to an example embodiment of the present invention.

FIG. 4 shows a detailed schematic of the HSC 20 according to an example embodiment of the present invention. As shown in FIG. 4, the HSC 20 may include an OR gate 100, a counter 110, an XOR gate 120, and the flip-flop, e.g., a flip-flop 130. The OR gate 100 receives the reset signal 25 and the bypass signal 27 as input. The OR gate 100 produces an output signal, reset_or_bypass 111 which is connected to the counter 110.

The counter 10 may include, as inputs, the toggle signal 37, the decode_H signal 24, the decode_L signal 26, the prescale_only signal 22, the div_clk signal 12, and the reset_or_bypass signal 111. The counter 110 may output the prestate signal 33, the state signal 35, and a togglenow signal 319, which is provided as an input to the XOR gate 120.

The XOR gate 120 performs an exclusive or function using two inputs: the togglenow signal 319 and the state_buf signal 29. The bypass signal 27 is input to the XOR gate 120 as a control signal which forces the XOR gate output to a logic HIGH when the divider is in bypass mode.

The flip-flop 130 receives as its D input an output signal, next_state 129 of the NOR gate 120. The div_clk 12 signal may be used as a clock input of the flip-flop 130. The flip-flop 130 also receives the bypass signal 27, the reset signal 25, and the set_state signal 21 as control inputs. Outputs of the flip-flop 130 include a Q output 107, an inverted output, QB, which is used as the stateb signal 105, and the state_buf signal 29, which is a buffered version of the Q signal 107. Based on this arrangement, it can be seen that when the togglenow signal 319 is asserted, the next_state signal 129 will be the opposite of the current state of the flip-flop 130, as indicated by the state_buf signal 29. Effectively, the togglenow signal 319 functions to switch the next_state signal 129 from HIGH to LOW and vice versa, thereby defining the HIGH and LOW phases of what will eventually become the output signal 59 of the device 101.

Figure 5:
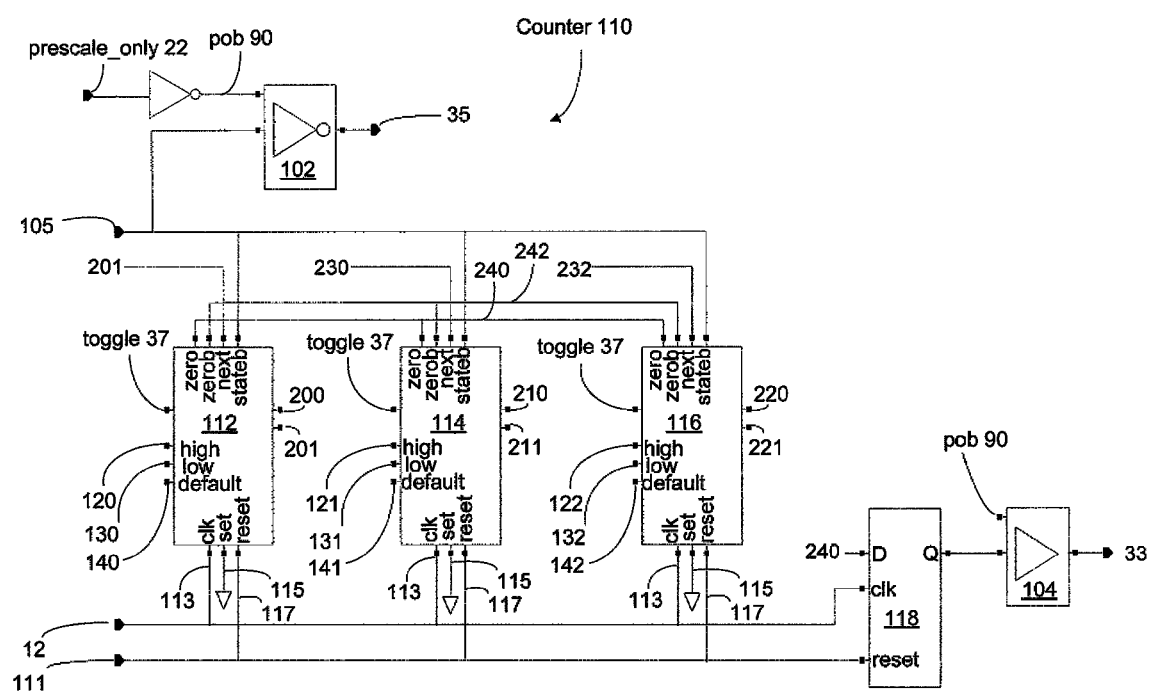
FIG. 5 shows a detailed schematic of a counting arrangement of the high speed counter of FIG. 4, according to an example embodiment of the present invention.

FIG. 5 shows a detailed schematic of the counter 110 according to an example embodiment of the present invention. The counter 110 includes 3-bits, each of which may be implemented using any programmable memory element configured to perform counting. In the embodiment shown, each bit includes high, low, and default load inputs, a clock input, set and reset control inputs, and a 1-bit output. As shown in FIG. 5, counter bits 112, 114, and 116 may respectively have high load inputs 120, 121, and 122, low load inputs 130, 131, and 132, default load inputs 140, 141, and 142, clock inputs 113, set inputs 115, and reset inputs 117. Each counter bit 112, 114, and 116 may produce a pair of complementary, 1-bit memory outputs, e.g., 200 and 201, 210 and 211, and 220 and 221, respectively. The order of the counter bits, from least significant to most significant, is 112, 114, and 116.

The stateb signal 105 may be input to an inverter 102, which is enabled by a pob signal 90 and produces the state signal 35, thereby propagating the current state of the flip-flop 130 to the LSC 30 when the pob signal 90 is asserted, e.g., when the division ratio exceeds the threshold. The pob signal 90 is an inversion of the prescale_only signal 22.

The set input 115 may be tied to ground, as it is not used in this embodiment. The reset inputs 115 are connected to the reset_or_bypass signal 111. The clock inputs 113 may be connected to the div_clk signal 12. Each counter bit 112, 114, and 116 may also receive a zero signal 240, a zerob signal 242, a next signal, e.g., signals 201, 230, and 232, respectively, and the stateb signal 105, as control inputs which will be described below with reference to FIGS. 6 and 7.

The counter 110 may include a latch, e.g., a D-flip-flop 118, which receives the div_clk signal 12 as a clock input, and the zero signal 240 as its D input. A Q output of the D-flop-flop 118 is connected to a buffer 104 which is enabled by the pob signal 90 and produces the prestate signal 33, thereby sending the clock (prestate signal 33) to the LSC 30 when the HSC 20 reaches zero.

Figure 6:
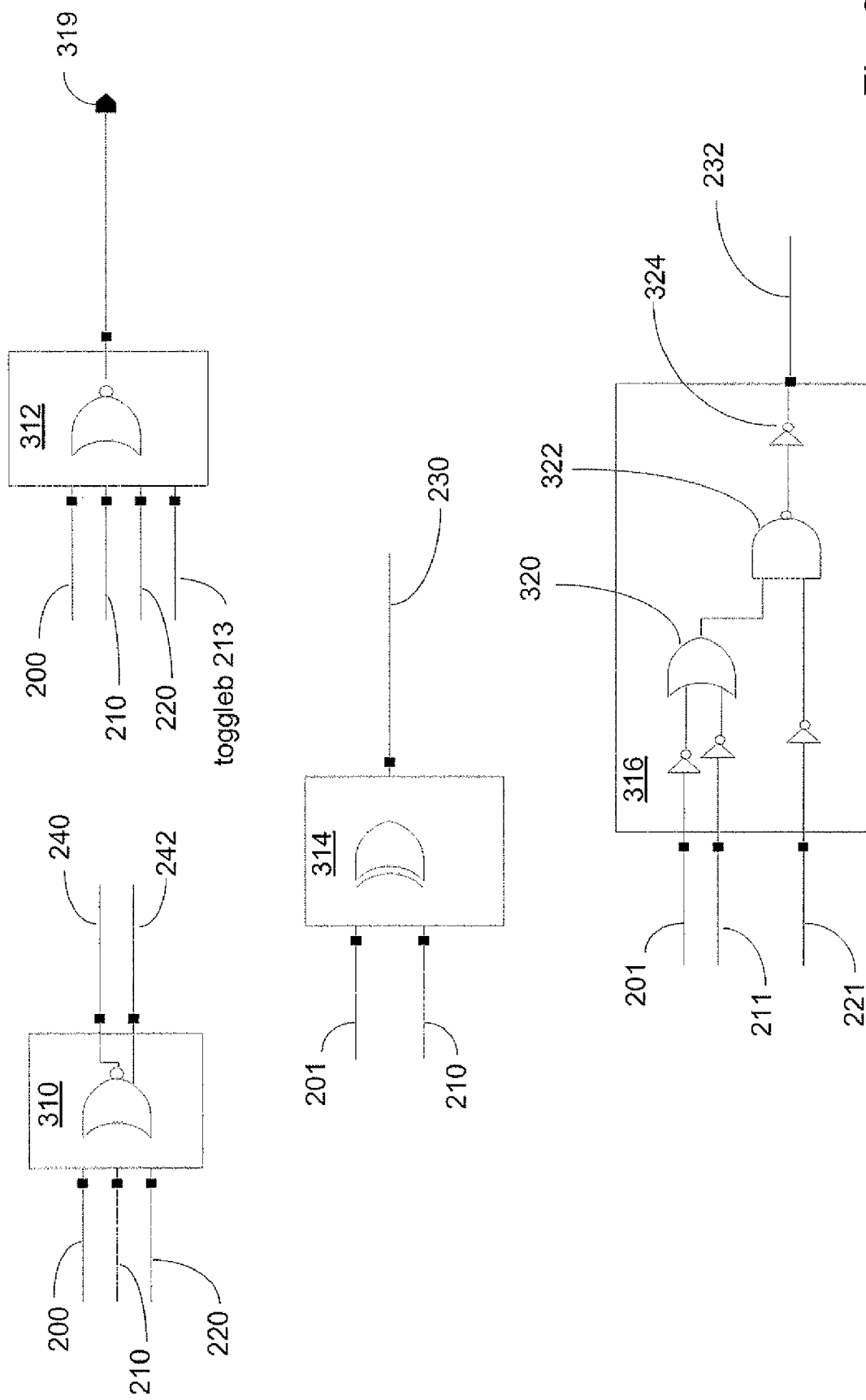
FIG. 6 shows control logic of the counting arrangement of FIG. 5, according to an example embodiment of the present invention.

FIG. 6 shows control logic of the counter 110 according to an example embodiment of the present invention. The counter control logic may be used to generate various control signals previously described, and may include a combination OR-NOR gate 310 a NOR gate 312, an XOR gate 314, and a combination circuit 316 which includes an OR gate 320 in combination with an NAND gate 322. Although the control logic has been shown separately for illustration purposes, it will be understood that other methods of implementing the counter control logic, e.g., by combining logic gates, are also possible.

The OR-NOR gate 310 receives the first memory output of each counter bit as input, e.g., bits 200, 210, and 220, and produces an OR output, e.g., the zerob signal 242, along with a NOR output, e.g., the zero signal 240. Thus, the zero signal 240 indicates whether the current value of the counter 110 is zero and the zerob signal 242 is the complement of the zero signal 240.

The NOR gate 312 receives, in addition to the first memory outputs 200, 210 and 220, a toggleb signal 213 as input. The toggleb signal 213 is essentially the complement of the toggle signal 37 output by the LSC 30. The NOR gate 312 produces the togglenow signal 319 as output. Thus, the togglenow signal 319 is asserted when both the HSC 20 and the LSC 30 are zero, as indicated respectively by the first memory outputs 200, 210 and 220, and the toggle signal 213.

The next signals 201, 230, and 232 respectively represent the next value of the counter bits 112, 114, and 116. The signal 201 is the second memory output, e.g., an inverted output, of the counter bit 112. The next signals 230 and 232 are respectively produced by the XOR gate 314 and the combination circuit 316.

The XOR gate 314 receives the second memory output 201 and the first memory output 210 as input and produces the next signal 230 as output.

The combination circuit 316 receives the second memory output 201 and the second memory output 211 as inverted inputs to the OR gate 320. The NAND gate 322 receives the output of the OR gate 320 and an inverted version of the second memory output 221 as input. Output of the NAND gate 322 is inverted by an inverter 324 to produce the next signal 232.

Figure 7:
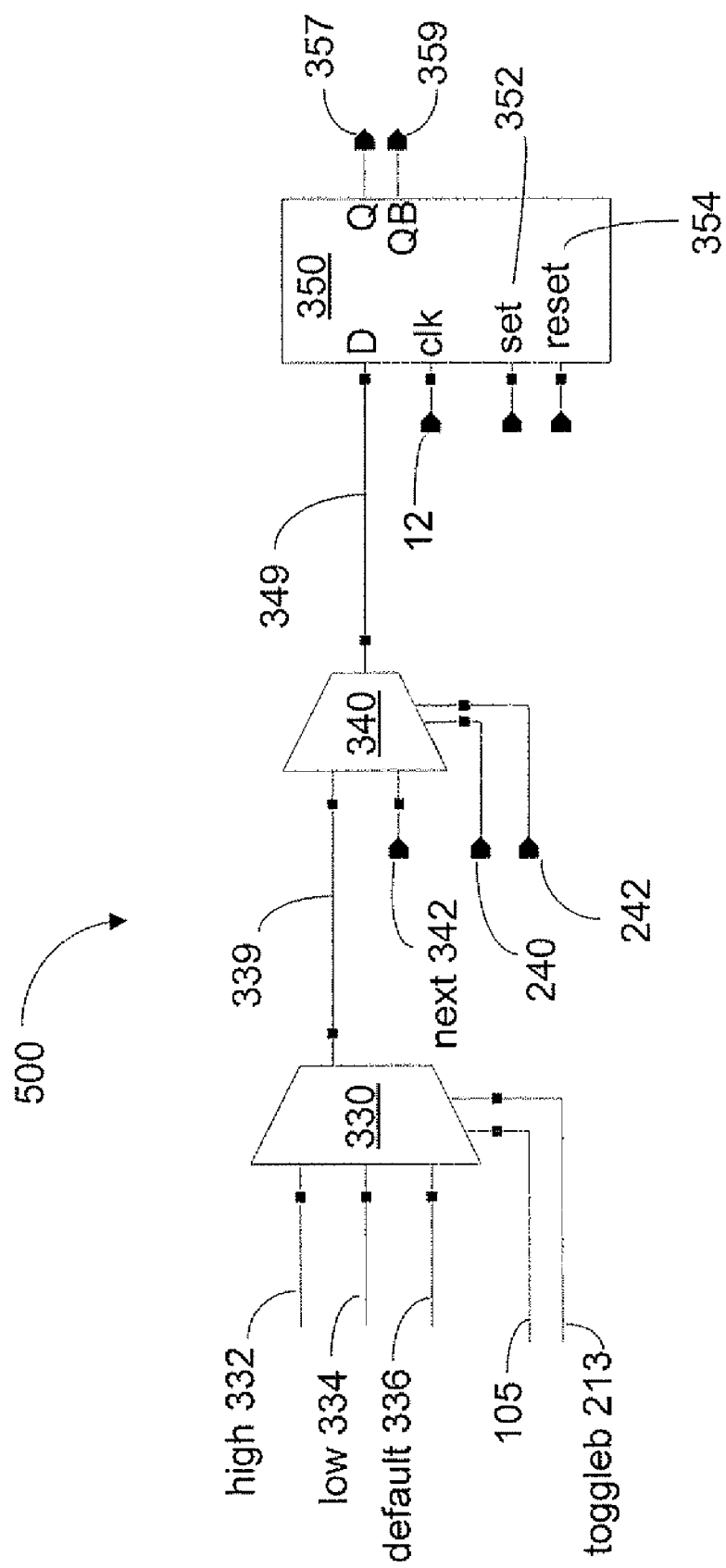
FIG. 7 shows a detailed schematic of an individual bit of the counting arrangement of FIG. 5, according to an example embodiment of the present invention.

FIG. 7 shows a detailed schematic of an individual counter bit 500 according to an example embodiment of the present invention. The counter bit 500 may be used to implement the counter bits 112, 114, and 116, and includes a multiplexer (mux) 330, a mux 340, and a flip-flop, e.g., a D-flip-flop 350.

The mux 330 receives a high load value 332, a low load value 334, and a default load value 336 as inputs. The stateb signal 105 and the toggleb signal 213 are used to select from among the inputs of the mux 330.

A selected input of the mux 330 is received as an input 339 to the mux 340 along with a next signal 342, e.g., one of the next signals 201, 230, and 232. The zero signal 240 and the zerob signal 242 are used to select from among the inputs of the mux 340.

A selected input of the mux 340 is received as a D input 349 of the D-flip-flop 350, which is clocked by the div_clk signal 12. A set input 352 and a reset input 354 of the D-flip-flop 350 are asynchronous inputs respectively corresponding to the set input 115 and the reset input 117 of a counter bit. The D-flip-flop produces complementary outputs 357 and 359, e.g., the first and second memory outputs of each counter bit 112, 114, and 116.

Figure 8:
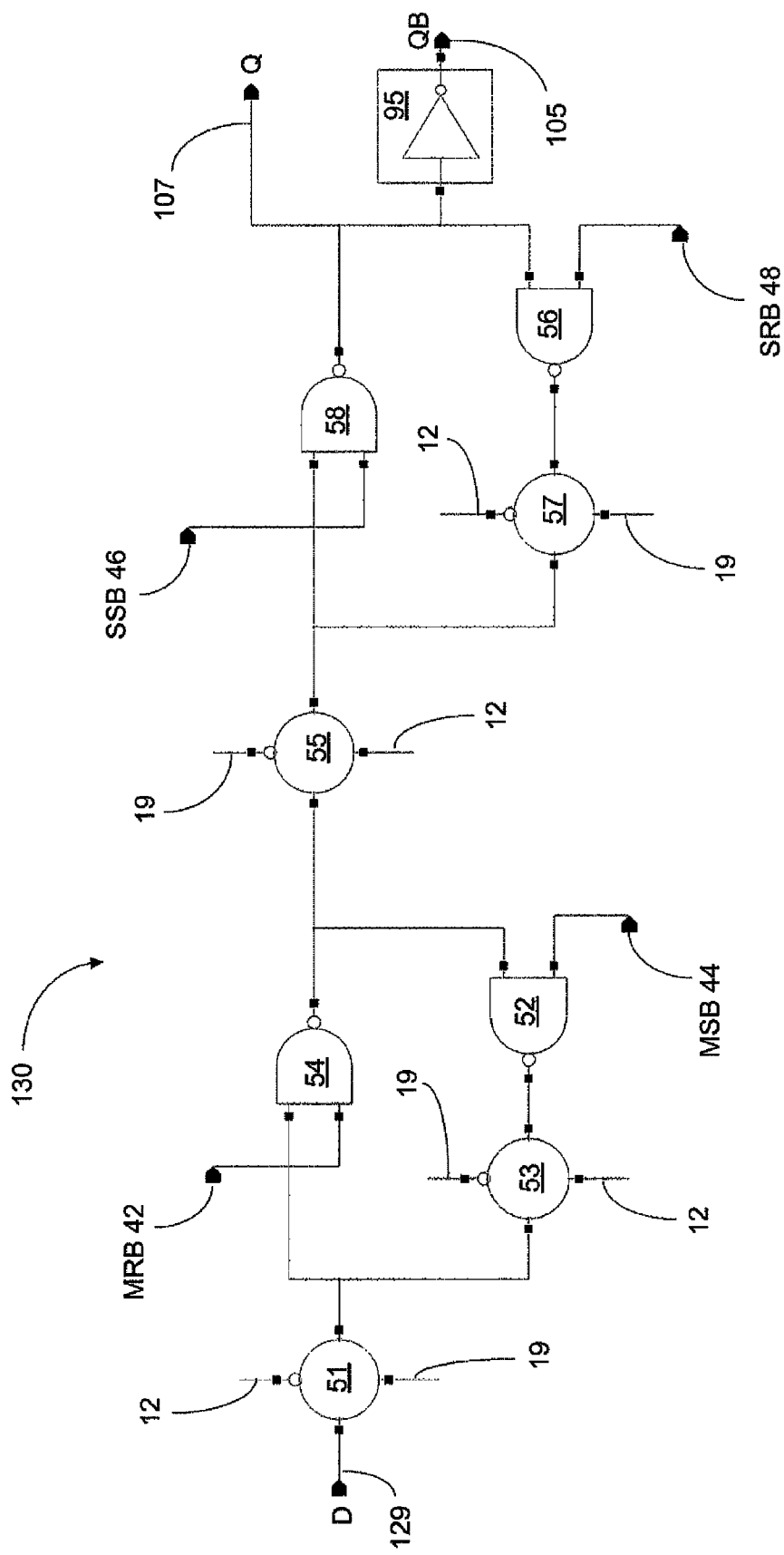
FIG. 8 shows a detailed schematic of an output arrangement according to an example embodiment of the present invention.

FIG. 8 shows a detailed schematic of the flip-flop 130 according to an example embodiment of the present invention. The flip-flop 130 may be a positive edge-triggered master-slave flip-flop implemented using transmission gates 51, 53, 55, and 57, and NAND gates 52, 54, 56, and 58. The flip-flop 130 may also include an inverter 95. The div_clk signal 12 is used as an active-high control input to the transmission gates 53 and 55, and as an active-low control input to the transmission gates 51 and 57. A signal 19 is the complement of the div clk signal 12 and used as an active-high control input to the transmission gates 51 and 57, and as an active-low control input to the transmission gates 53 and 55.

An input of the flip-flop 130, e.g., the next_state signal 129, is received at the transmission gate 51, an output of which is connected to a first input of the NAND gate 54, which receives a master_reset_bar (MRB) signal 42 as a second input. Output of the NAND gate 54 is connected to a first input of the NAND gate 52 and an input of the transmission gate 55. The NAND gate 52 receives a master_set_bar (MSB) signal 44 as a second input. Output of the NAND gate 52 is connected to an input of the transmission gate 53. Output of the transmission gate 53 is connected the first input of the NAND gate 54. Output of the transmission gate 55 is connected to a first input of the NAND gate 58, which receives a slave-set_bar (SSB) signal 46. Output of the NAND gate 58 is used as a Q output of the flip-flop 130, e.g., the Q signal 107, which is also connected to the inverter 95 to produce a complementary output, QB, e.g., the stateb signal 105. The Q signal 107 is also connected to a first input of the NAND gate 56, which receives a slave_reset_bar (SRB) signal 48 as a second input. Output of the NAND gate 56 is connected to the transmission gate 57, which is in turn connected to the first input of the NAND gate 58. The MRB signal 42 and the SRB signal 48 may be complements of the reset signal 25. The MSB signal 44 and the SSB signal 46 may be complements of the set_state signal 21.

Figure 9:
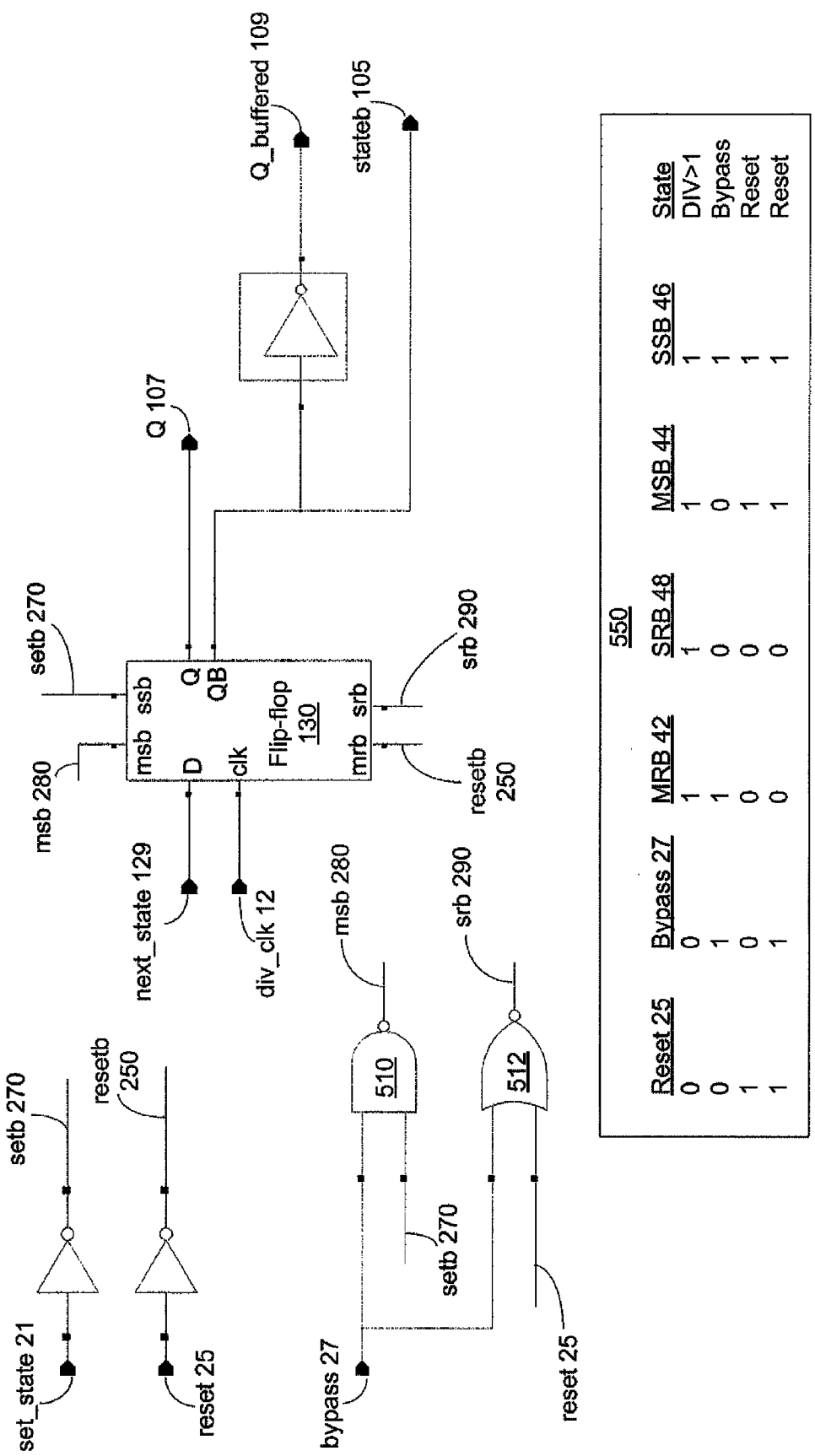
FIG. 9 shows a partial truth table along with control logic for the output arrangement of FIG. 8, according to an example embodiment of the present invention.

FIG. 9 shows a partial truth table 550 and control logic for the flip-flop 130 of FIG. 8, according to an example embodiment of the present invention. The set_state signal 21 is inverted to form a setb signal 270 as the SSB input. The reset signal 25 is inverted to form a resetb signal 250 as the MRB input. The bypass signal 27 and the setb signal 270 are input to a NAND gate 510 to form an msb signal 280 as the MSB input. The bypass signal 27 and the reset signal 25 are input to a NOR gate 512 to form an srb signal 290 as the SRB input. The Q and QB outputs of the flip-flop 130 are generated in accordance with the truth table 550. The QB output may also be inverted to form a buffered output signal, Q_buffered 109, e.g., the state_buf signal 29 of FIG. 4.

The truth table 550 illustrates how the flip-flop 130 can be switched between division and bypass modes through independent control of the MRB signal 42, the MSB signal 44, the SSB signal 46, and the SRB signal 48. During a normal division mode, the reset signal 25 and the bypass signal 27 are zero (logic level LOW) while the MRB signal 42, SRB signal 48, MSB signal 44, and SSB signal 46 are all one (logic level HIGH). Bypass mode is enabled by setting the bypass signal to one and respectively setting the MRB signal 42, the SRB signal 48, the MSB signal 44, and the SSB signal 46 to one, zero, zero, and one. During the bypass mode, the D input 129 is forced HIGH by the XOR gate 120 so that the NAND gate 54 always receives a logic HIGH whenever the transmission gate 51 is engaged. Because MSB=0, the output of the NAND gate 52 is always HIGH, so the NAND gate 54 receives a logic HIGH whenever the transmission gate 53 is engaged. Therefore, the output of the NAND gate 54 is always LOW so the master latch in the flip flop 130 is always driving a logic LOW into the transmission gate 55 (e.g., the slave latch).

In the case of the slave latch, the SSB=1 means that the NAND gate 58 follows (and inverts) its input, while the SRB=0 means the NAND gate 56 has a logic HIGH on its output. As the transmission gates 55 and 57 are toggled by the clock 19, an input to the NAND gate 58 changes from a logic LOW (gate 55 engaged) to a logic HIGH (gate 57 engaged) at exactly the same time as the input clock 19. An advantage to implementing the bypass mode in this manner is that since the slave latch is now operating as a buffer using the NAND gate 58, the NAND gate 58's input is being toggled between logic HIGH and LOW in the same manner and using the same transmission gates as would occur in a non-bypass mode (e.g., normal division). Therefore, the propagation delays for aligned edges should match in both modes.

Figure 10:
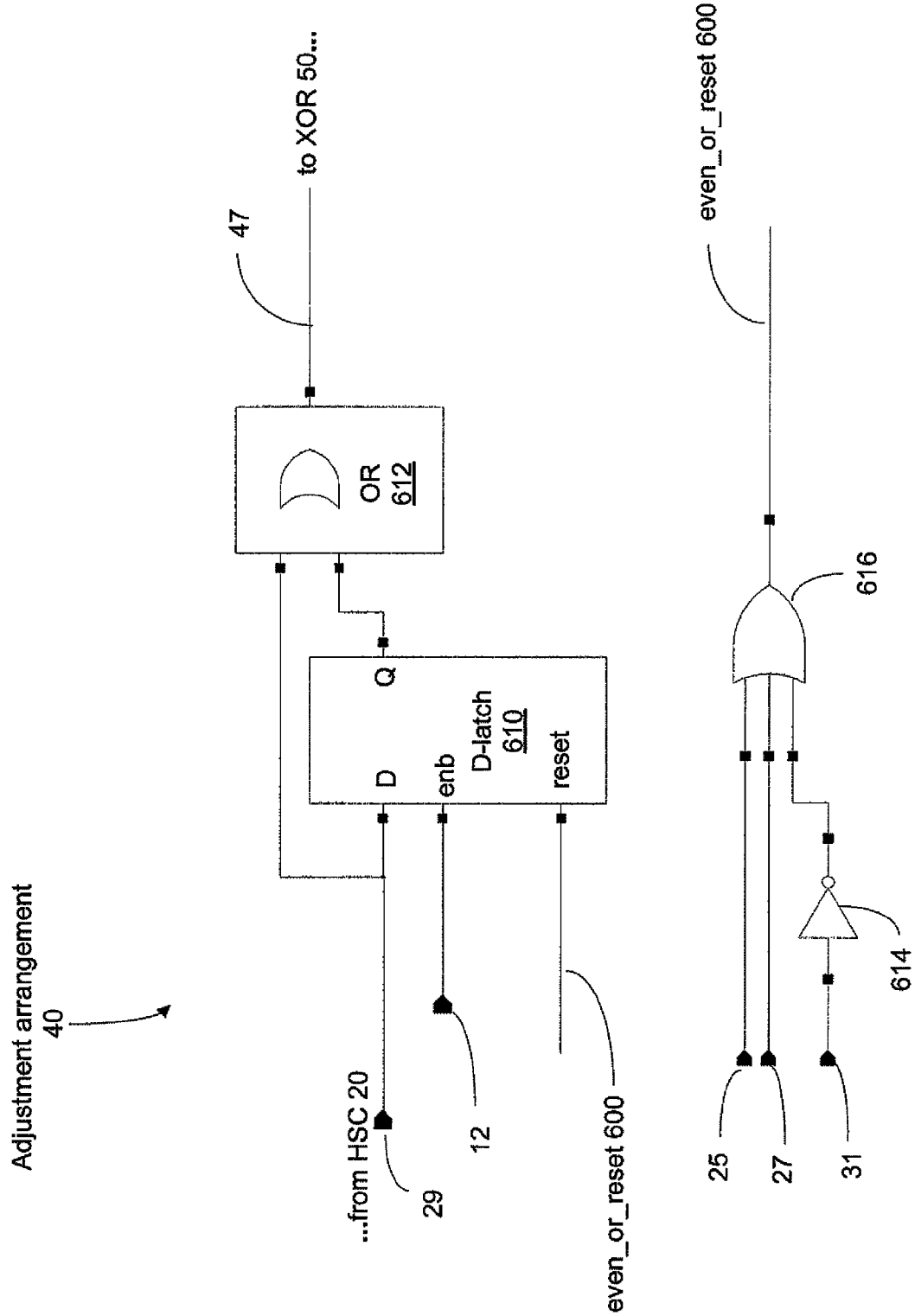
FIG. 10 shows a detailed schematic of an adjustment arrangement according to an example embodiment of the present invention.

FIG. 10 shows a detailed schematic of the adjustment arrangement 40 according to an example embodiment of the present invention. The adjustment arrangement 40 may include a latch, e.g., a D-latch 610, and an OR gate 612. FIG. 10 also shows exemplary control logic for the adjustment arrangement 40, including an inverter 614 connected to an input of an OR gate 616. The inverter 614 receives the odd signal 31 as input. The OR gate 616, in addition to the output of the inverter 614, receives the reset signal 25 and the bypass signal 27 as input, and produces an even_or_reset signal 600 as output.

The D-latch 610 receives the state_buf signal 29 generated by the flip-flop 130 of the HSC 20. The D-latch 610 is enabled by the div_clk signal 12 and receives the even_or_reset signal 600 as a reset input. Output of the D-latch 610 is connected to a second input of the OR gate 612, which receives the state_buf signal 29 as a first input and produces the adjusted output signal 47. In this configuration, the D-latch 610 is reset when the division ratio is even, bypass mode is active, or the reset signal 25 is asserted. An edge triggering of the D-latch 610 is opposite that of the HSC 20. For example, if the HSC 20 is rising edge-triggered, then the D-latch 610 is falling-edge triggered. As a result, when the division ratio is odd, the D-latch 610 samples the state_buf signal 29 on a triggering (e.g., falling) edge of the div_clk signal 12 and keeps the current value of the state_buf signal 29 until the next triggering edge. This enables the OR gate 612 to perceive the state_buf signal 29 for an extra half cycle. Effectively, this configuration extends the perceived HIGH phase of the state_buf signal 29 by a half cycle while shortening the perceived LOW phase of the state_buf signal 29 by a half cycle.

Although other duty cycle adjustment arrangements exist and specific implementations will vary, e.g., based on how the load values are calculated, it will be appreciated that the embodiment shown in FIG. 10 is simple to implement. For example, since an OR gate can be implemented in CMOS by simple modifications to an inverter, and since an inverter is often already being used as a fan-out buffer, implementing the adjustment arrangement 40 may require minimal additional hardware, and, as a result, there may be little impact on the jitter of the output signal 59.

As described above, programmable phase offsets may be achieved using different initial presets. For example, using a different LO preset value so that the HSC 20 starts counting down from a different value when the division ratio does not exceed the threshold. Using different LHI, LLO, HI and LO presets for the first output clock cycle would result in the first cycle out of the counter having a different period than the later cycles. In addition, phase offsets may also be programmed using different initial default values. One method of implementing different presets during the first cycle is to add a phase word to the division ratio (e.g., phase+ratio, where phase=0 means no adjustment) and then decode the preset values in the same manner as previously described. After the counter has finished the first cycle, normal values for LHI, LLO, HI and LO are then used as the presets. This may be combined with additional circuitry used to gate off the first output clock cycle (e.g., by waiting until the first falling edge of the output before enabling a buffer), so that it looks like the output clock did not go through the first cycle. Yet another method for programming phase offsets is to adjust the starting phase using one or more of the set_state and reset signals 21, 25, the presets, and the default values. For example, the set_state signal 21 and the reset signal 25 may be used in combination with the presets. Further combinations are also possible.

In addition to phase offsets, different duty cycles may be programmed by adjusting the equations described above with reference to the operation of the HSC 20 and the LSC 30. The equations may be adjusted in a manner that maintains the same total division while giving amounts of time to each output phase. The equations may be adjusted by, for example, using presets and/or default values for the HSC 20 and the LSC 30 that differ from those in the original equations. The equations may also be adjusted by dynamically changing the presets and/or default values used from cycle to cycle. As an illustrative example, when the division ratio is below the threshold, the equations may be adjusted by using HI=2 and LO=0, resulting in a division of (HI+1)+(LO+1)=4 with a 75/25 duty cycle.

Figure 11:
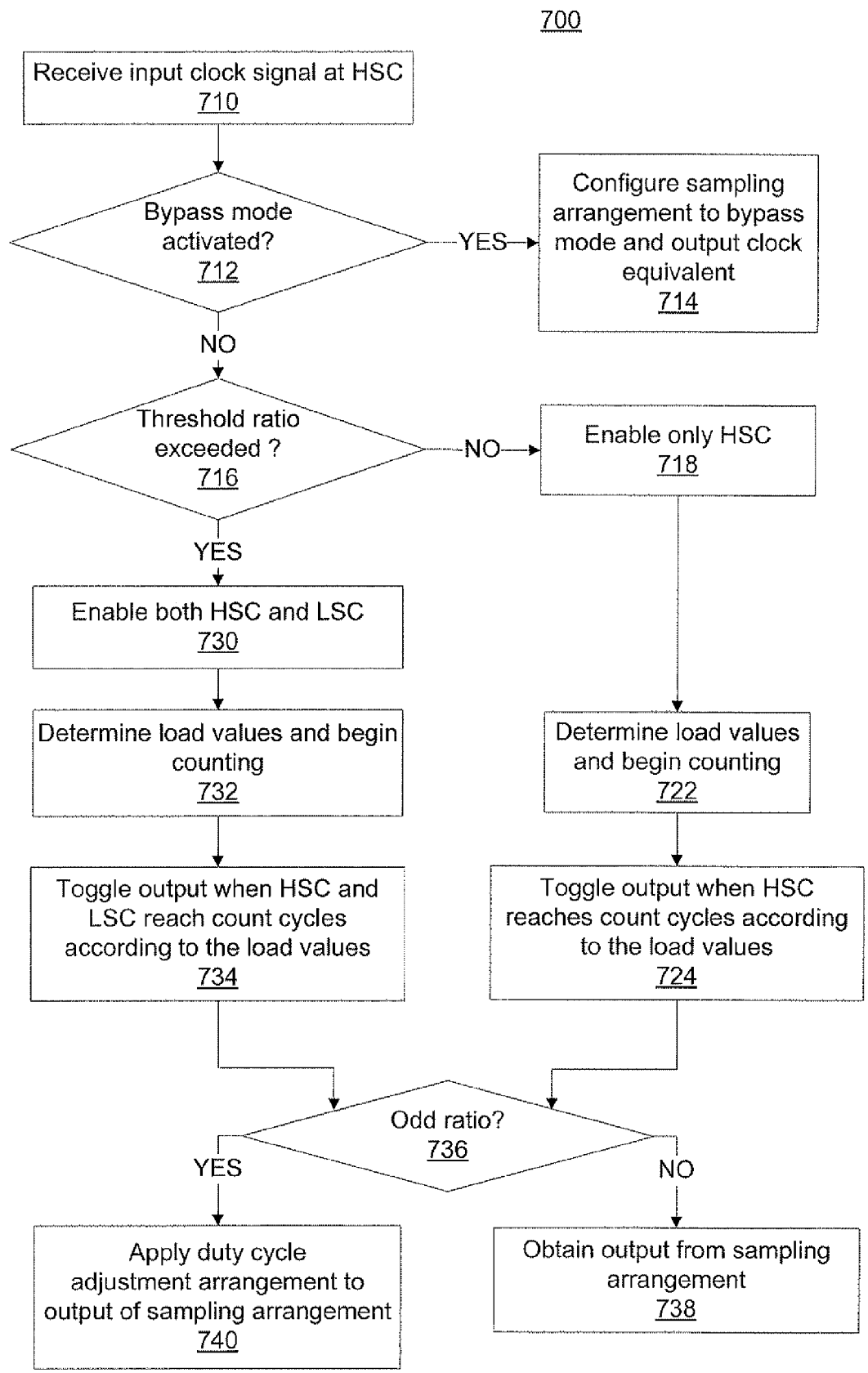
FIG. 11 shows a method for dividing a frequency signal according to an example embodiment of the present invention.

FIG. 11 shows a method 700 for dividing a frequency signal according to an example embodiment of the present invention. The method 700 may be implemented using the device 101 and any of the exemplary embodiments of its components previously described. In 710, an input clock signal, e.g., the div_clk signal 12, may be received at an HSC.

In 712, it may be determined whether the bypass mode has been activated.

If the bypass mode is activated, then the method 700 proceeds to 714, where the output arrangement, e.g., the flip-flop 130, may be configured to a bypass mode such that an output of the output arrangement is the equivalent of the input clock.

If the bypass mode is not activated, then the method 700 proceeds to 716, where it may be determined whether the division ratio exceeds the threshold ratio.

If the threshold ratio is exceeded, then the method proceeds to 718, where only the HSC is enabled. The method 700 then proceeds to 722.

In 722, load values for the HSC may be determined, e.g., the HI and LO values, and counting begins. The method 700 then proceeds to 724.

In 724, an output signal may be toggled when the HSC reaches a predetermined number of count cycles according to the load values. This may occur, for example, by toggling the flip-flop 130 when the HSC reaches zero. The method 700 then proceeds to 736.

If the threshold ratio is not exceeded, then the method proceeds to 730, where both the HSC and a LSC clocked by the HSC are enabled. The method 700 then proceeds to 732.

In 732, load values for the HSC and the LSC may be determined, e.g., the HI, LO, LHI, and LLO values, and counting begins in both the HSC and the LSC. The method 700 then proceeds to 734.

In 734, the output signal may be toggled when both the HSC and the LSC reach predetermined number of count cycles according to the load values. This may occur, for example, by toggling the flip-flop 130 when both the HSC and the LSC reach zero. The method 700 then proceeds to 736.

In 736, it may be determined whether the division ratio is odd-valued. If the division ratio is even, then an output of the division may be obtained from the output arrangement in 738. However, if the division ratio is odd, then the output of the division may be obtained by applying a duty cycle adjustment arrangement to the output of the output arrangement in 740.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense.

What is claimed is:

1. A method for dividing a frequency, comprising:
receiving a first signal having a first frequency as a clock input to a first digital counter;
receiving a desired division ratio as a digitally input number;
outputting a second signal as a clock input to a second digital counter having a higher counting capacity than the first counter, the output occurring when the first counter reaches a first number of count cycles; and
generating a third signal having a high cycle and a low cycle, which are determined at least as a function of the first number of count cycles, the third signal having, in accordance with the desired division ratio, a frequency lower than the first frequency, wherein the high and low cycles of the third signal are determined as a function of the first number of count cycles, and not a second number of count cycles associated with the second counter, when a value of the desired division ratio does not exceed a predetermined threshold division ratio value, and as a function of both the first number of count cycles and the second number of count cycles when the value of the desired division ratio exceeds the threshold division ratio value.

2. The method of claim 1, wherein the threshold division ratio value is equal to $2*2^k$, where k is equal to the number of bits in the first counter.

3. The method of claim 1, wherein the first and second number of count cycles correspond to respective load values of the first and second counters.

4. The method of claim 1, wherein the third signal has a native 50/50 duty cycle when the desired division ratio is even-valued.

5. The method of claim 1, further comprising:
adjusting durations of the high and low cycles of the third signal to create a 50/50 duty cycle when the desired division ratio is odd-valued.

6. The method of claim 1, wherein the first counter is a 3-bit counter.

7. The method of claim 1, further comprising:
programming a duty cycle of the third signal by at least one of adjusting a load value of at least one of the counters and adjusting a default value of at least one of the counters.

8. A method for dividing a frequency, comprising:
receiving a first signal having a first frequency as a clock input to a first digital counter;
outputting a second signal as a clock input to a second digital counter having a higher counting capacity than the first counter, the output occurring when the first counter reaches a first number of count cycles;
generating a third signal having a high cycle and a low cycle, which are determined at least as a function of the first number of count cycles, the third signal having a frequency lower than the first frequency, wherein the high and low cycles of the third signal are determined as a function of the first number of count cycles when a desired division ratio does not exceed a threshold value, and as a function of both the first number of count cycles and a second number of count cycles associated with the second counter when the desired division ratio exceeds the threshold value;
when the threshold value is not exceeded, toggling the third signal between high and low values when the first number of count cycles is reached; and
when the threshold value is exceeded, toggling the third signal between the high and low values only when both the first number of count cycles and the second number of count cycles are reached.

9. A method for dividing a frequency, comprising:
receiving a first signal having a first frequency as a clock input to a first digital counter;
outputting a second signal as a clock input to a second digital counter having a higher counting capacity than the first counter, the output occurring when the first counter reaches a first number of count cycles;

generating a third signal having a high cycle and a low cycle, which are determined at least as a function of the first number of count cycles, the third signal having a frequency lower than the first frequency; and adjusting durations of the high and low cycles of the third signal to create a 50/50 duty cycle when the desired division ratio is odd-valued, wherein the adjusting is performed by latching the third signal using the first signal as a clock input to a latch, an edge-triggering of the clock input of the latch being opposite that of the clock input to the first counter.

10. The method of claim 9, further comprising:
generating a final output signal by performing a logical OR operation on the third signal and the latched third signal.

11. A method for dividing a frequency, comprising:
receiving a first signal having a first frequency as a clock input to a first digital counter;
outputting a second signal as a clock input to a second digital counter having a higher counting capacity than the first counter, the output occurring when the first counter reaches a first number of count cycles; and
generating a third signal having a high cycle and a low cycle, which are determined at least as a function of the first number of count cycles, the third signal having a frequency lower than the first frequency, wherein the third signal is generated by a master-slave flip-flop selectively configured to operate between a first mode in which an output of the flip-flop is the third signal and a second mode in which an output of the flip-flop matches the first signal.

12. The method of claim 11, further comprising:
switching between the first and second modes by independently controlling set and reset inputs of a master latch and a slave latch of the flip-flop in conjunction with controlling an input of the master latch.

13. A method for dividing a frequency, comprising:
receiving a first signal having a first frequency as a clock input to a first digital counter;
outputting a second signal as a clock input to a second digital counter having a higher counting capacity than the first counter, the output occurring when the first counter reaches a first number of count cycles;
generating a third signal having a high cycle and a low cycle, which are determined at least as a function of the first number of count cycles, the third signal having a frequency lower than the first frequency;
programming a phase offset of the third signal by at least one of controlling a set input of at least one of the counters;
controlling a reset input of at least one of the counters;
adjusting a load value of at least one of the counters; and
adjusting a default value of at least one of the counters.

14. A device for dividing a frequency, comprising:
a first digital counter configured to receive a first signal having a first frequency as a clock input;
a second digital counter configured to:
receive a second signal as a clock input, the second counter having a higher counting capacity than the first counter, the second signal being output when the first counter reaches a first number of count cycles, and
receive a desired division ratio as a digitally input number; and
an output arrangement configured to generate a third signal having a high cycle and a low cycle, which are determined at least as a function of the first number of count cycles, the third signal having, in accordance with the desired division ratio, a frequency lower than the first frequency, wherein the high and low cycles of the third signal are determined as a function of the first number of count cycles, and not a second number of count cycles associated with the second counter, when a value of the desired division ratio does not exceed a predetermined threshold division ratio value, and as a function of both the first number of count cycles and the second number of count cycles when the value of the desired division ratio exceeds the threshold division ratio value.

15. The device of claim 14, wherein the threshold division ratio value is equal to $2*2^k$, where k is equal to the number of bits in the first counter.

16. The device of claim 14, wherein the first and second number of count cycles correspond to respective load values of the first and second counters.

17. The device of claim 14, wherein the third signal has a native 50/50 duty cycle when the desired division ratio is even-valued.

18. The device of claim 14, further comprising:
a duty cycle adjustment arrangement configured to adjust durations of the high and low cycles of the third signal to create a 50/50 duty cycle when the desired division ratio is odd-valued.

19. The device of claim 14, wherein the first counter is a 3-bit counter.

20. The device of claim 14, wherein a duty cycle of the third signal is programmed by at least one of adjusting a load value of at least one of the counters and adjusting a default value of at least one of the counters.

21. A device for dividing a frequency, comprising:
a first digital counter configured to receive a first signal having a first frequency as a clock input;
a second digital counter configured to receive a second signal as a clock input, the second counter having a higher counting capacity than the first counter, the second signal being output when the first counter reaches a first number of count cycles;
an output arrangement configured to generate a third signal having a high cycle and a low cycle, which are determined at least as a function of the first number of count cycles, the third signal having a frequency lower than the first frequency, wherein the high and low cycles of the third signal are determined as a function of the first number of count cycles when a desired division ratio does not exceed a threshold value, and as a function of both the first number of count cycles and a second number of count cycles associated with the second counter when the desired division ratio exceeds the threshold value; and
a toggling arrangement configured to:
when the threshold value is not exceeded, toggle the third signal between high and low values when the first number of count cycles is reached, and
when the threshold value is exceeded, toggle the third signal between the high and low values only when both the first number of count cycles and the second number of count cycles are reached.

22. A device for dividing a frequency, comprising:
a first digital counter configured to receive a first signal having a first frequency as a clock input;
a second digital counter configured to receive a second signal as a clock input, the second counter having a higher counting capacity than the first counter, the second signal being output when the first counter reaches a first number of count cycles; and an output arrangement configured to generate a third signal having a high cycle and a low cycle, which are determined at least as a function of the first number of count cycles, the third signal having a frequency lower than the first frequency; and a duty cycle adjustment arrangement configured to adjust durations of the high and low cycles of the third signal to create a 50/50 duty cycle when the desired division ratio is odd-valued, wherein the adjustment arrangement includes a latch configured to latch the third signal using the first signal as a clock input, an edge-triggering of the clock input of the latch being opposite that of the clock input to the first counter.

23. The device of claim 22, wherein a final output signal is generated by performing a logical OR operation on the third signal and the latched third signal.

24. A device for dividing a frequency, comprising:
a first digital counter configured to receive a first signal having a first frequency as a clock input;
a second digital counter configured to receive a second signal as a clock input, the second counter having a higher counting capacity than the first counter, the second signal being output when the first counter reaches a first number of count cycles; and
an output arrangement configured to generate a third signal having a high cycle and a low cycle, which are determined at least as a function of the first number of count cycles, the third signal having a frequency lower than the first frequency, wherein the output arrangement includes a master-slave flip-flop selectively configured to operate between a first mode in which an output of the flip-flop is the third signal and a second mode in which an output of the flip-flop matches the first signal.

25. The device of claim 24, wherein the first and second modes are selected by independently controlling set and reset inputs of a master latch and a slave latch of the flip-flop in conjunction with controlling an input of the master latch.

26. A device for dividing a frequency, comprising:
a first digital counter configured to receive a first signal having a first frequency as a clock input;
a second digital counter configured to receive a second signal as a clock input, the second counter having a higher counting capacity than the first counter, the second signal being output when the first counter reaches a first number of count cycles; and
an output arrangement configured to generate a third signal having a high cycle and a low cycle, which are determined at least as a function of the first number of count cycles, the third signal having a frequency lower than the first frequency, wherein a phase offset of the third signal is programmed by at least one of controlling a set input of at least one of the counters, controlling a reset input of at least one of the counters, adjusting a load value of at least one of the counters, and adjusting a default value of at least one of the counters.

* * * * *